United States Patent
Srinidhi Embar et al.

(10) Patent No.: US 10,826,439 B2
(45) Date of Patent: Nov. 3, 2020

(54) LINEARITY ENHANCEMENT OF HIGH POWER AMPLIFIERS

(71) Applicant: NXP USA, Inc., Austin, TX (US)

(72) Inventors: Ramanujam Srinidhi Embar, Gilbert, AZ (US); Ibrahim Khalil, Gilbert, AZ (US); Abdulrhman M. S. Ahmed, Gilbert, AZ (US); Ricardo Uscola, Tempe, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/224,153

(22) Filed: Dec. 18, 2018

(65) Prior Publication Data
US 2020/0195201 A1 Jun. 18, 2020

(51) Int. Cl.
H03F 1/30 (2006.01)
H03F 1/32 (2006.01)
H03F 1/56 (2006.01)
H03F 3/213 (2006.01)

(52) U.S. Cl.
CPC .......... H03F 1/3205 (2013.01); H03F 1/565 (2013.01); H03F 3/213 (2013.01); H03F 2200/165 (2013.01); H03F 2200/222 (2013.01); H03F 2200/267 (2013.01); H03F 2200/444 (2013.01); H03F 2200/451 (2013.01)

(58) Field of Classification Search
CPC ...................................................... H03F 1/30
USPC ................................................ 330/285, 296
See application file for complete search history.

(56) References Cited

U.S. PATENT DOCUMENTS

| 8,013,673 B2* | 9/2011 | Makioka | H03F 1/32 330/124 R |
| 8,587,271 B2 | 11/2013 | Kanbe et al. | |
| 8,736,349 B2 | 5/2014 | Chen et al. | |
| 8,963,643 B2* | 2/2015 | Lautzenhiser | H03G 3/3036 330/285 |
| 2011/0181324 A1 | 7/2011 | Gesche et al. | |
| 2015/0349723 A1* | 12/2015 | Kwon | H03F 3/195 330/289 |
| 2018/0026029 A1 | 1/2018 | Lin et al. | |

FOREIGN PATENT DOCUMENTS

JP S61-296804 A 12/1986

OTHER PUBLICATIONS

Khalil et al., "Linearity enhancement of GaN Doherty amplifier by forward gate current blocking method"; conference paper; presented at 2018 IEEE/MTT-S International Microwave Symposium; Jun. 2018; 3 pages.

* cited by examiner

*Primary Examiner* — Henry Choe

(57) ABSTRACT

A radio frequency (RF) amplifier circuit includes a field effect transistor (FET) (e.g., a FET belonging to a III-V FET enhancement group), where the FET includes a gate terminal coupled to an RF input node. The circuit further includes a prematch and biasing network coupled between a bias voltage node and the RF input node. The prematch and biasing network includes a nonlinear gate current blocking device configured to block a current from flowing between the bias voltage node and the RF input node.

19 Claims, 6 Drawing Sheets

LINEARITY ENHANCEMENT OF HIGH POWER AMPLIFIERS

FIELD OF THE DISCLOSURE

The present disclosure relates generally to linearity enhancements in power amplifiers for radio frequency (RF) circuits, and more particularly to RF amplifiers that are susceptible to forward gate current.

BACKGROUND OF THE DISCLOSURE

RF amplifiers typically include transistors for amplifying an RF input signal. Such transistors may include high-power field effect transistors (FETs) that provide more linear signals, if properly biased. Transistors belonging to, for example, the III-V FET enhancement group, may exhibit current collapse, trapping, and memory effects. One type of III-V FETs may include Gallium Nitride (GaN) FETs. While GaN FETs may demonstrate excellent open-loop linearity, linearizing a GaN amplifier employing, for example, digital predistortion (DPD) may be problematic at high transmission rates. Furthermore, in multistage power amplifiers, such as Doherty amplifiers, the main amplifier may often be operated in an overdrive mode which may result in clipping of the input and/or output signals. Such clipping of the input signal may introduce further undesirable nonlinearities in an output signal of the power amplifier.

Therefore, it would be advantageous to mitigate waveform clipping in nonlinear active devices.

DETAILED DESCRIPTION

Figure 1:
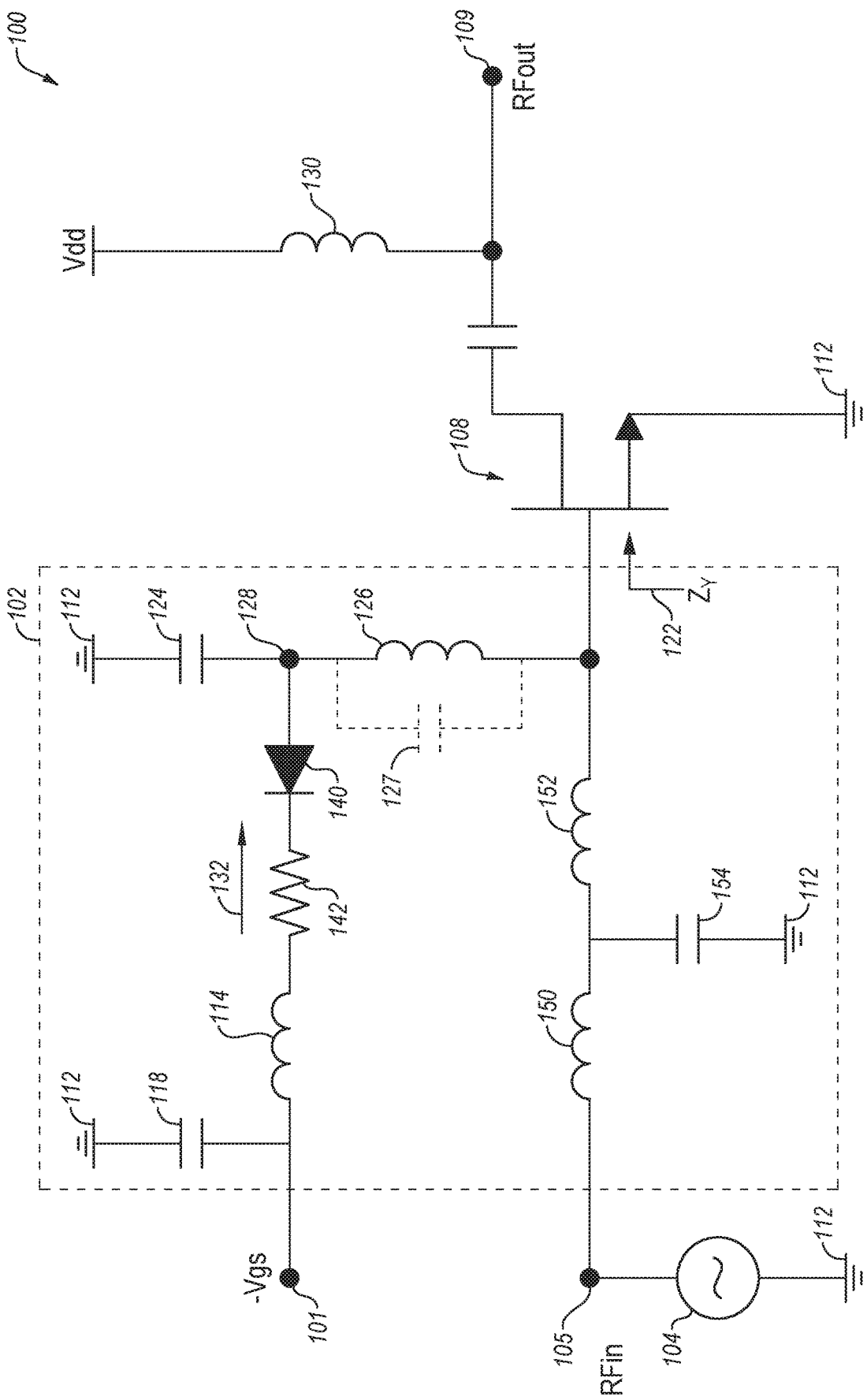
FIG. 1 is a schematic depicting a power amplifier circuit including a prematch network, in accordance with an embodiment.

The present disclosure encompasses a variety of embodiments of circuits and systems in which an operating point for an overdriven power amplifier may be dynamically adjusted to mitigate distortion in the RF output signal. The operating point of the power amplifier is maintained in the linear operating range by shifting the bias voltage Vgs as presented at the gate terminal of the power amplifier. One such technique for shifting the bias voltage may include blocking the current flowing between the gate node and the bias input node.

In one embodiment, a radio frequency (RF) amplifier circuit includes a field effect transistor (FET), and in a more particular embodiment, the FET belongs to a III-V FET enhancement group. For example, the FET may be a gallium nitride (GaN) FET, although the FET may be formed from other types of substrates, as well. Either way, the FET includes a gate terminal coupled to an RF input node. The circuit further includes a prematch and biasing network coupled between a bias voltage node and the RF input node. The prematch and biasing network includes a nonlinear gate current blocking device configured to block a current from flowing between the bias voltage node and the FET input. The nonlinear gate current blocking device may be a p-n diode. The amplifier circuit may further include an inductor coupled between the FET input and an RF cold point node coupled to the nonlinear gate current blocking device. The prematch and biasing network may also be configured as a low pass filter coupled between the bias voltage node and the RF cold point node. The amplifier circuit may further be configured as a Doherty amplifier with first and second FETs, and first and second prematch and biasing networks as described above.

In another embodiment, a radio frequency (RF) amplifier includes a substrate and a first RF amplifier circuit coupled to the substrate. The first RF amplifier circuit includes a first field effect transistor (FET), where the first FET includes a gate terminal coupled to a first RF input node. The first RF amplifier circuit further includes a first network coupled between a first bias voltage node and the first gate terminal. The first network includes a first nonlinear gate current blocking device configured to block a first current from flowing between the first bias voltage node and the first gate terminal.

The first nonlinear gate current blocking device may be a p-n diode. The RF amplifier may further include a first inductor coupled between the RF input node and an RF cold point node coupled to the first nonlinear gate current blocking device. The RF amplifier may further include a shunt capacitor coupled in shunt with the first inductor. The RF amplifier may further include a first capacitor coupled between the RF cold point and a ground reference. The RF amplifier may also be configured as a low pass filter coupled between the first bias voltage node and the RF cold point node.

In a further embodiment, a radio frequency (RF) module includes a printed circuit board (PCB) and an RF amplifier device coupled to the PCB. The RF amplifier device includes a substrate, a field effect transistor (FET) having a gate terminal coupled to an RF input node, and a network coupled between a bias voltage node and the gate terminal of the FET. The network includes a nonlinear gate current blocking device configured to block a current from flowing between the bias voltage node and the gate terminal.

The RF module may further include an integrated passive device (IPD) including the FET, wherein the IPD and the nonlinear gate current blocking device are coupled to the PCB. The RF module may further include an integrated passive device (IPD) including the FET and the nonlinear gate current blocking device, wherein the IPD is coupled to the PCB.

According to the various embodiments described herein, linearity of power amplifiers is an important design consideration for facilitating higher data bandwidths and for minimizing interference with adjacent channels. When RF input signals are relatively small, power amplifiers may operate in their linear regions. However, when RF input signal levels cause the power amplifier to operate outside of the linear range, undesirable nonlinearities may be introduced that may cause distortion in the RF output signal. An overdriven power amplifier may suppress the distortion by moving the operating point of the power amplifier to accommodate the higher RF input signal levels. The operating point may be adjusted by shifting the bias voltage Vgs as presented at the gate terminal of the power amplifier. One such technique for shifting the bias voltage may include blocking the current flowing between the gate node and the bias input node.

FIG. 1 is a schematic depicting a power amplifier circuit 100 including a prematch and biasing network 102 connected to an FET 108. The prematch and biasing network 102 may include a nonlinear gate current blocking device 140, as further described herein, to dynamically control biasing of the input of the FET 108. The dynamic biasing of the input of the FET 108 may help to prevent clipping of the input and/or output RF signal thereby improving the linearity of the power amplifier circuit. Forward gate current blocking may protect the power amplifier, more particularly the FET 108, from catastrophic failure modes during overdrive conditions. Moreover, intermodulation distortion may also be improved.

Field effect transistors (FETs), such as FET 108, used in RF applications, typically require DC biasing of the RF input signal. The DC biasing utilizes a bias voltage, commonly denoted as the gate-to-source voltage Vgs. The bias voltage sets an operating point for the FET 108. For transistors, such as High Electron Mobility Transistors (HEMT), the DC voltage at the gate terminal is kept negative, usually between −5 to 0 V. An HEMT transistor is a FET incorporating a junction between two materials with different band gaps (i.e., a heterojunction) as the channel. Accordingly, the level of the negative bias voltage Vgs, present at the gate terminal of the transistor, controls the current flow in the channel between the drain and the source of the FET. Accordingly, a very small negative current, resulting from the negative voltage, flows from a node at the gate terminal of the FET, as indicated by current 132.

Forward gate current occurs during overdrive conditions as the normally-on GaN FETs are biased with negative voltages at the desired bias condition. In such a condition, a very small negative DC current may flow toward the gate terminal causing the internal gate diode of the FET be reverse biased. As the RF drive signal, RFin, is increased, the gate current may rise slowing and abruptly invert the polarity to a positive direction at very high drive levels. If forward current blocking is implemented, as described herein, using a nonlinear gate current blocking device, then the gate current may be restricted and the positive current may be entirely blocked.

As illustrated in FIG. 1, power amplifier circuit 100 may be an RF circuit for an electronic device (e.g., a wireless communications base station) and may generally include a signal source 104 coupled between a ground node 112 and an RF input node 105. The FET 108 couples at a gate terminal to the RF input node 105, at a source terminal to a ground node 112, and at a drain terminal to an RF output node 109. The power amplifier circuit 100 further may include an RF choke 130 coupled between the RF output node 109 and a power source Vdd. The RF choke 130 protects the Vdd source from RF contamination.

The power amplifier circuit 100 further includes a prematch and biasing network 102 coupled between a bias voltage node 101, the gate terminal of FET 108, and the RF input node 105. The prematch and biasing network 102 includes inductor 114, capacitor 118, a DC blocking capacitor 124, inductor 126, inductor 150, inductor 152, capacitor 154, and a resistor 142, in an embodiment. Inductors 150, 152 and capacitor 154 function as a matching network between the RF input node 105 and the gate terminal of FET 108. The capacitor 118, inductor 114, and resistor 142 function as, for example, a filter for video bandwidth (VBW) frequencies. An inductance 126 is coupled in series with a capacitor 124 between node 128 and ground node 112 to form a shunt-L matching topology. The shunt-L circuitry is designed by selecting values for 126 and 124 that compensate for impedance lowering effects of the gate-source capacitance value Cgs, which may desirably ensure a good broadband fundamental source impedance match for input network 102.

The prematch and biasing network 102 is configured to provide impedance matching between the bias voltage node 101 and the gate terminal of the FET 108 at a fundamental frequency of operation of the FET 108. More specifically, the prematch and biasing network 102 is configured to raise the impedance of FET 108 to a higher impedance level (e.g., in a range from about 2 to about 30 ohms or higher). Accordingly, the prematch and biasing network 102 may be considered to be an input impedance matching circuit. Increasing the impedance is advantageous in that it allows the printed circuit board (PCB) level matching interface from a driver stage to have an impedance that can be achieved in high-volume manufacturing with minimal loss and variation.

Prematch and biasing network 102 is generally configured so that source side impedance Zx 120 (i.e., at RF input node 105) matches the input side impedance Zy 122 (i.e., at the gate of FET 108). For example, if source side impedance Zx 120 is 50 Ohms, input side impedance Zx 120 should also be approximately 50 Ohms. The failure to match the impedances could result in sub-standard performance of the circuit and, specifically reduced efficiency of FET 108. In this example, prematch and biasing network 102 functions to match the input side impedance Zy 122 to the source side impedance Zx 120. As used herein, input side is meant to refer to the input of the FET 108. However, it is understood that other terminology could be used. For example the input could be referred to as the load side or gate/base of the power amplifier transistor (not shown).

In an alternative embodiment, a capacitor 127 may be coupled in shunt with the inductor 126 to form an LC resonator. Capacitor 127 resonates with the inductor 126 at the fundamental frequency to form a bandpass network. In addition, using this configuration the effective inductance reduces enabling lower baseband impedance. Further, it should be understood that although power amplifier circuit 100 is described as being an RF circuit, other circuit types could be implemented. Moreover, it should be understood that the components depicted are not intended to be limiting and power amplifier circuit 100 could include additional resistors, capacitors, power amplifiers, and the like.

The prematch and biasing network 102 further includes a nonlinear gate current blocking device 140 coupled between an RF cold point node 128 and the inductor 114 (or between the gate of FET 108 and the bias voltage node 101). An RF cold point is a node in a circuit that is relatively absent of any RF signal. More particularly, the RF cold point node 128 may function as a virtual ground reference voltage for RF electrical signals. If the RF cold point node 128 were ideal, then during device operation, little or no RF energy at the power amplifier circuits center operating frequency would be present at the RF cold point node 128. In accordance with the present disclosure, the prematch and biasing circuit 102, typically used for biasing and baseband decoupling, includes an integrated nonlinear gate current blocking device 140 coupled to the RF cold point to control the flow of gate current 132. For example, the nonlinear gate current blocking device 140 may substantially block forward gate current when peaks of the RF input signal enter the nonlinear region of the performance of the FET 108. Blocking forward gate current 132 forces the FET 108 to remain in the linear operating region of the FET and avoid clipping of the RF input signal.

The nonlinear gate current blocking device 140 may be implemented by using a p-n diode in series between the bias voltage node 101 and the RF cold point node 128. More particularly, an anode of the p-n diode is coupled to the input of the FET 108 through the RF cold point node 128 (and inductor 126), and a cathode of the p-n diode is coupled to the bias voltage node 101 (e.g., through the series combination of resistor 142 and inductor 114). The integrated nonlinear gate current blocking device 140 may block current flowing towards the gate terminal of the FET 108 from the bias voltage Vgs source.

Figure 2:
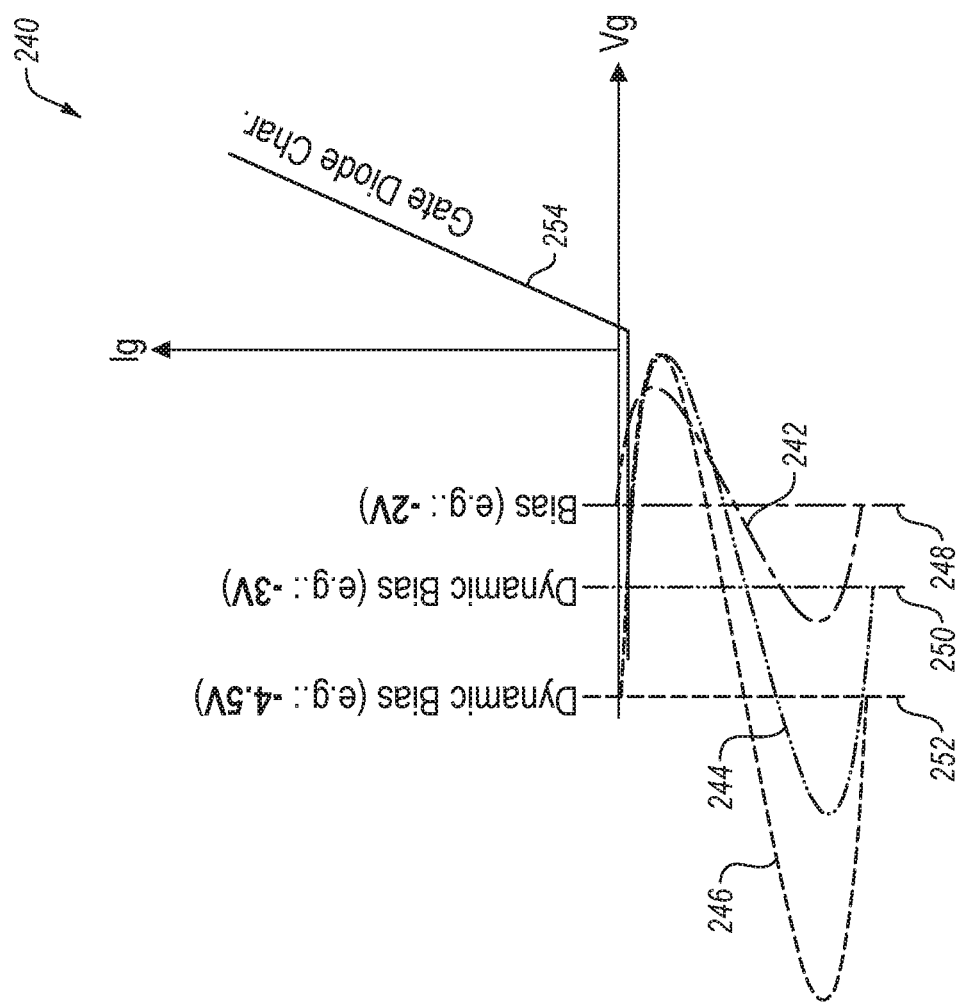
FIG. 2 illustrates two waveforms associated with gate biasing of a power amplifier circuit including a FET.
Figure 2:
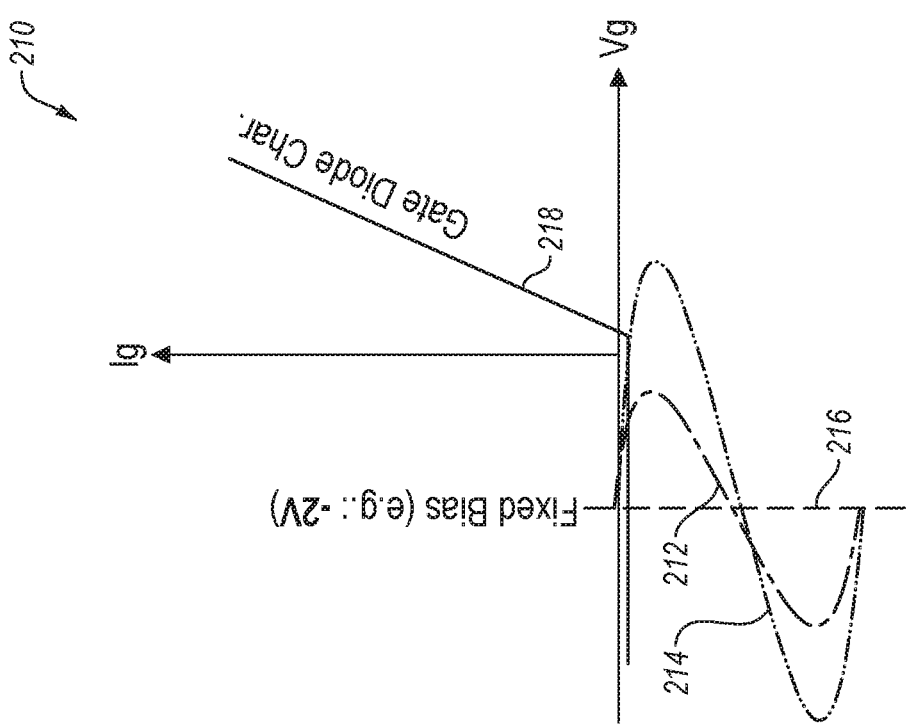

FIG. 2 illustrates two waveforms associated with gate biasing of the FET 108 of FIG. 1, implemented as a GaN FET. A first plot 210 illustrates operation of FET 108 without forward current blocking where the gate terminal of the FET encounters the nonlinearity region of operation when the RF input signal level increases and causes the gate diode of the FET 108 to conduct.

A second plot 240 illustrates operation with forward current blocking where the gate terminal of the FET 108 does not encounter the nonlinearity region of operation when the RF input signal level increases because a level of the bias voltage at the gate terminal of FET 108 dynamically shifts in response to the increased signal levels of the RF input signal. Such dynamic shifting of the level of the bias voltage, as seen at the gate terminal, prevents the internal gate diode of the FET 108 from conducting.

Specifically, the plot 210 illustrates a problem associated with overdriving a transistor, such as the FET 108 of FIG. 1. Plot 210 illustrates two RF input signals 212, 214 operating at a fixed bias voltage 216, and a waveform 218 is also plotted and is representative of a diode characteristic of the internal gate diode of a transistor, such as the FET 108.

In one example, the RF input signal 212 operates with a smaller voltage swing that does not cause the gate diode of FET 108 to conduct and thereby does not introduce nonlinearities into a generated RF output signal. In another example, the RF input signal 214 operates with a larger voltage swing that does cause the gate diode of FET 108 to conduct (forward biased) and thereby does introduce undesirable nonlinearities into a generated RF output signal.

A plot 240 illustrates a solution to the transistor overdriving problem illustrated with respect to plot 210. Plot 240 illustrates three RF input signals 242, 244, 246 operating at different bias voltages 248, 250, 252. A waveform 254 is also plotted and is representative of a diode characteristic of the gate diode of a transistor, such as the FET 108.

In one example, the RF input signal 242 operates with a smaller voltage swing about a first bias voltage 248 that does not cause the gate diode of FET 108 to conduct and thereby does not introduce nonlinearities into a generated RF output signal. In another example, the RF input signal 244 operates with a midrange voltage swing about a second bias voltage 250 (i.e., dynamic bias voltage) that also does not cause the gate diode of FET 108 to conduct and thereby also does not introduce nonlinearities into a generated RF output signal. In yet another example, the RF input signal 246 operates with a high voltage swing about a third bias voltage 252 (i.e., dynamic bias voltage) that also does not cause the gate diode of FET 108 to conduct and thereby also does not introduce nonlinearities into a generated RF output signal. The shifting of the bias voltages is a result of the dynamic nature of the nonlinear gate current blocking device 140 as described herein.

Figure 3:
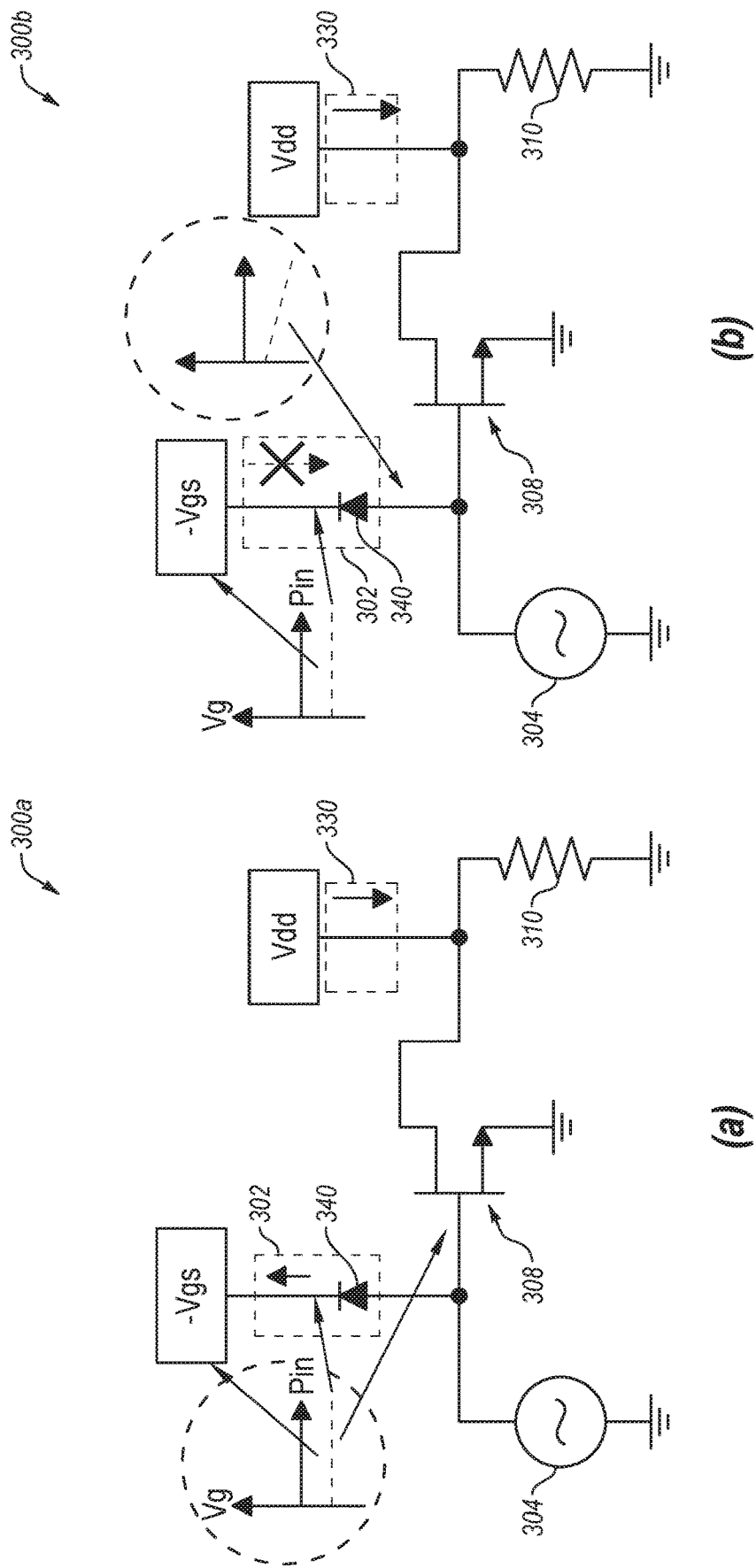
FIG. 3 illustrates a power amplifier circuit in two different states of operation, (a) a normal or non-overdriven state, and (b) an overdriven state, in accordance with an embodiment.

FIG. 3 illustrates the circuit of FIG. 1 in two different states of operation, (a) a normal or non-overdriven state, and (b) an overdriven state. For clarity, the capacitors, inductors, and resistor of the prematch and biasing network (e.g., components 114, 118, 124, 126, 150, 152, 154, 142) are not illustrated in FIG. 3, although they may be included in a fully-depicted embodiment. A gate terminal of the FET 308 couples to the bias voltage Vgs through a prematch and biasing network, a portion of which, for clarity, is illustrated as prematch and biasing network 302, and to the RF input signal source 304. A source terminal of the FET 308 couples to a ground reference and a drain terminal of the FET 308 couples to an RF choke 330 and a load 310.

The prematch and biasing network 302 of power amplifier circuit 300 includes, among other elements not shown for clarity, a nonlinear gate current blocking device 340, which is positioned such that a forward bias current at the gate terminal of FET 308 is inhibited. As stated above, the FET 308 may be a GaN FET or other HEMT device which is normally-on with a gate voltage of 0 Volts, resulting in the gate terminal being biased with a negative voltage for proper operation. Accordingly, with a negative bias voltage on the gate terminal of the FET 308, a very small negative current flows towards the gate terminal resulting in the internal gate diode of FET 308 being reverse biased. Therefore, the negative bias voltage at the gate of FET 308 results in a negative current being provided to the gate terminal of the FET 308.

Increasing RF input signal from source 304 causes the previously negative current level to start increasing towards zero. When RF input signal from the source becomes very high, the gate current tries to shift towards positive values. In this operating condition and without nonlinear gate current blocking device 340, the internal gate-diode of the FET 308 operates in forward bias and may be easily damaged. The gate diode of the FET 308 is typically a Schottky diode formed within the FET 308.

The embodiments describe herein, restrict the gate current from shifting toward positive values through the inclusion of the nonlinear gate current blocking device 340 in the prematch and biasing network 302. As the current approaches zero, the FET 308 pinches off causing the DC voltage at the gate terminal of the FET 308 to become even more negative, resulting in a self-adjustment of the gate bias point of the FET 308.

The nonlinear gate current blocking device 340 may be realized as a diode (e.g., a p-n diode) arranged to allow a negative current to pass through to the gate terminal of FET 308 and to block a positive current from reaching the gate terminal of FET 308. More particularly, an anode of the diode is coupled to the gate terminal of the FET 308, and a cathode of the diode is coupled to the bias voltage node Vgs.

In operation, as the alternating or sinusoidal current of the RF input signal from signal source 304 at the gate terminal of FET 308 increases, the sum of the direct current and the alternating current may become positive in certain parts of the waveform. Consequently, due to the non-linear characteristic of the internal gate-diode of FET 308, the shape of the gate current becomes non-sinusoidal having larger positive areas than negative areas. Thus, the current at the gate terminal of FET 308 changes from negative to positive current. The nonlinear gate current blocking device 340 in the prematch and biasing network 302 limits the gate current to the negative region. This prevention of a positive gate current results in a DC self-adjustment of the operating point of the FET 308 by the DC blocking capacitor 124 of FIG. 1. Since the positive current is not allowed to pass through the nonlinear gate current blocking device 340, the DC blocking capacitor 124 becomes more negative in value, which is equivalent to a change of the bias voltage Vgs.

By way of example, the DC blocking capacitor 124 may be charged from −2V to −3V over time resulting in a shift of the operating point of the FET 308 from −2V to −3V. Accordingly, significant increases of the alternating current at the FET 308, which could result in undesirable distortions, may be mitigated by including the nonlinear gate current blocking device 340 in the prematch and biasing network 302 between the gate of the FET 308 and the bias voltage node 101 of FIG. 1.

Figure 4:
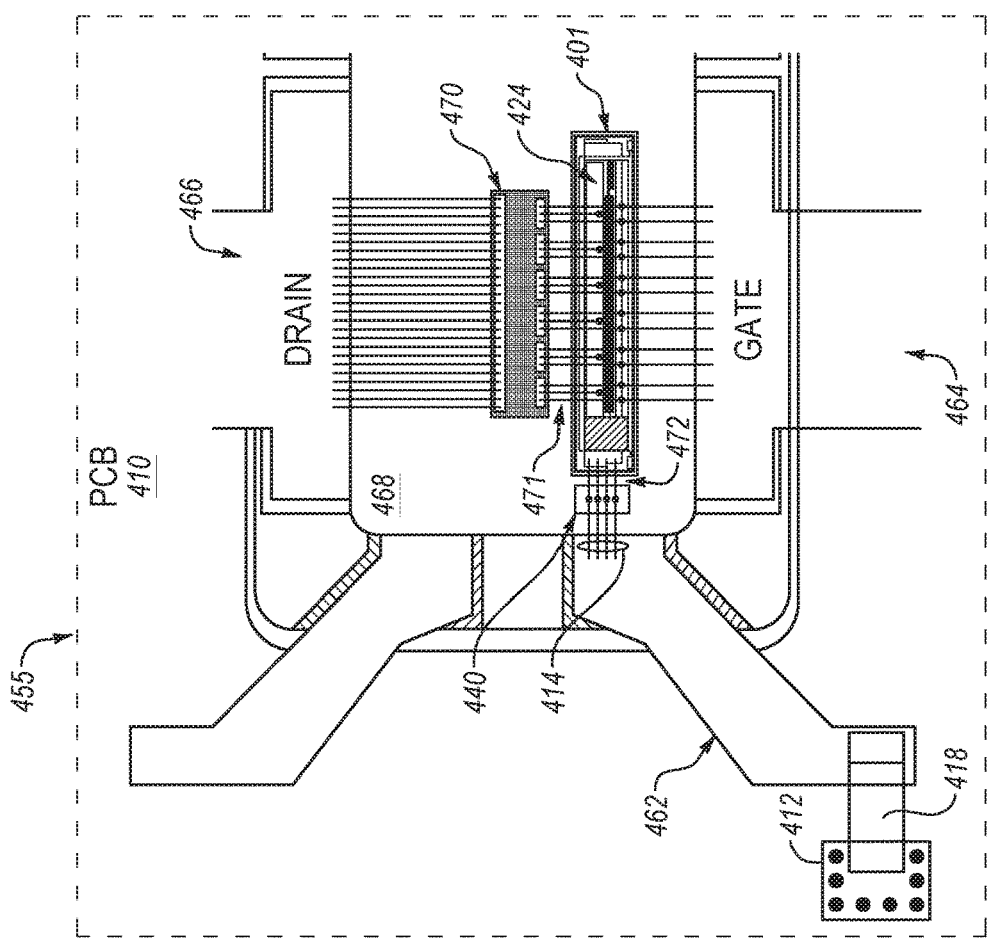
FIG. 4 illustrates a partial implementation of the power amplifier device on a printed circuit board (PCB), in accordance with an embodiment.

FIG. 4 illustrates a partial implementation of an RF device 455 (or integrated circuit package) on a printed circuit board (PCB) 410 including the power amplifier circuit of FIG. 1, in accordance with an embodiment. RF device 455 includes a substrate 468, an RF input lead 454, an RF output lead 466, a bias voltage lead 462, an integrated passive device (IPD) 401, a FET die 470 (e.g., a GaN FET die), a nonlinear gate current blocking device 440, and a plurality of wirebond arrays that electrically connect the above-described components and that form various inductances (e.g., inductances 150, 152, 126, FIG. 1, among others).

The embodiment of FIG. 4 illustrates one embodiment of packaging various components of a biasing and matching topology in an IPD 401, with a separate discrete nonlinear gate current blocking device 440 and a capacitor 418 external to the RF device 455. The RF device 455 includes a bias voltage lead 462 which couples to the bias voltage node 101 of FIG. 1. The bias voltage lead 462 further couples to capacitor 418 which may correspond to the capacitor 118 in the power amplifier circuit 100 of FIG. 1. The capacitor 418 further couples to a ground node 412 which corresponds to the ground node 112 in the power amplifier circuit 100 of FIG. 1. The RF device 455 further includes an RF input lead 464 which corresponds to the RF input node 105 in the power amplifier circuit 100 of FIG. 1 and couples to an RF signal source 104. The RF device 455 yet further includes an RF output lead 466 which corresponds to the RF output node 109 in the power amplifier circuit 100 of FIG. 1.

The RF device 455 includes a substrate 468 (or "flange") on which are mounted IPD 401, a FET die 470 (e.g., a GaN FET die), and a nonlinear gate current blocking device 440, which corresponds to the nonlinear gate current blocking device 140 in the power amplifier circuit 100 of FIG. 1. In the present embodiment, the IPD 401, the nonlinear gate current blocking device 440, and the FET die 470 are mounted on the same substrate 468. Substrate 468 may be formed from one or more conductive materials (e.g., copper), and serves as a ground reference node for the FET die 470 and the IPD 401 (e.g., substrate 468 corresponds to ground 112, FIG. 1). The leads 454, 462, 466 are electrically isolated from substrate 468, and provide for electrical connection between FET die 470 and circuitry external to the device 455 (e.g., bias voltage node 101 and signal source 104).

IPD 401 is a discrete component that includes a substrate and multiple components of the biasing and matching topology integrated therein and/or coupled thereto (e.g., inductor 114, capacitors 124, 154, and resistor 142, FIG. 1). The nonlinear gate current blocking device 440 may be configured as a second IPD, providing a reduction in size and an improvement in manufacturing for a power amplifier circuit.

The nonlinear gate current blocking device 440 couples to the bias voltage lead 462 by way of an inductor 414 (e.g., configured as a plurality of wirebonds) which corresponds to the inductor 114 in the power amplifier circuit 100 of FIG. 1. The nonlinear gate current blocking device 440 further couples to the gate terminal of the FET die 470 through the IPD 401 by way of a series of additional inductors (e.g., configured as a series circuit that includes wirebonds 471 between FET die 470 and IPD 401, a conductor within IPD 401, and wirebonds 472 between IPD 401 and blocking device 440), which corresponds to the inductor 126 in the power amplifier circuit 100 of FIG. 1. In an alternate embodiment, the nonlinear gate current blocking device 440 may be more directly coupled to the gate terminal of FET die 470 with a single set of wirebonds. The nonlinear gate current blocking device 440 further couples to a DC blocking capacitor 424 within IPD 401, which may correspond to the DC blocking capacitor 124 in the power amplifier circuit 100 of FIG. 1.

Figure 5:
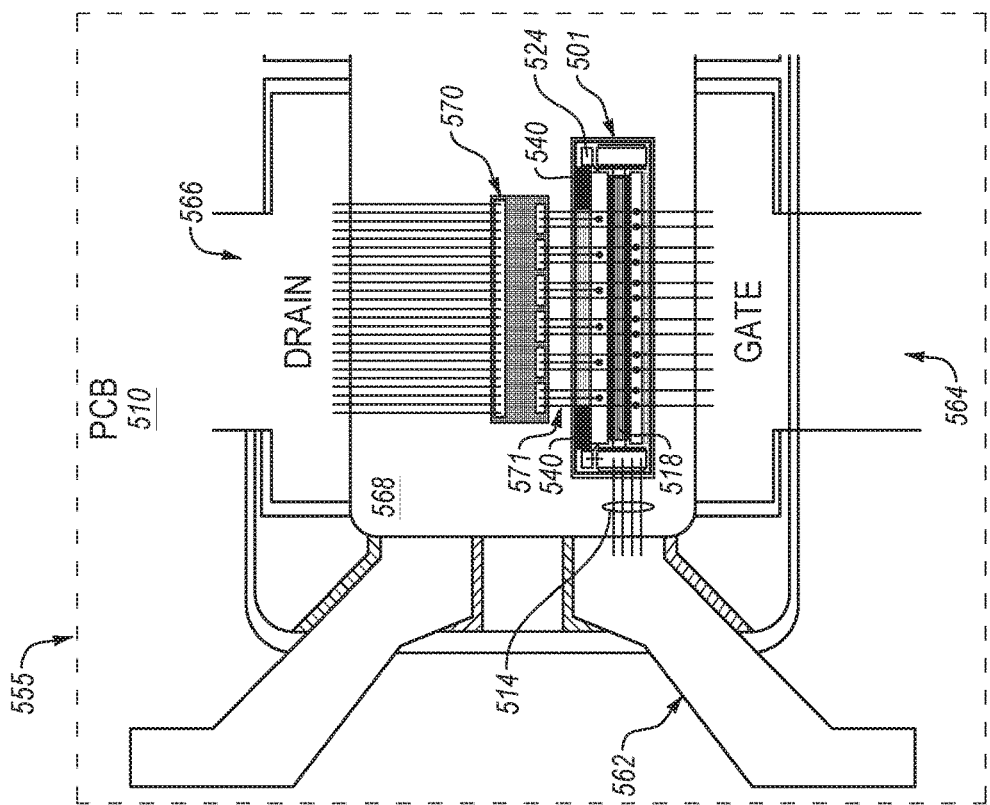
FIG. 5 illustrates a partial implementation of the power amplifier device on a PCB, in accordance with another embodiment

FIG. 5 illustrates a partial implementation of an RF device 555 (or integrated circuit package) on a printed circuit board (PCB) 510 including the power amplifier circuit of FIG. 1, in accordance with another embodiment. The embodiment of FIG. 5 illustrates another embodiment of packaging a portions of a matching topology in an integrated passive device 501, along with an integrated nonlinear gate current blocking device 540 and a capacitor 518 internal to the RF device 555. RF device 555 includes a substrate 568, an RF input lead 554, an RF output lead 566, a bias voltage lead 562, an IPD 501, a FET die 570 (e.g., a GaN FET die), a nonlinear gate current blocking device 540 coupled to or integrated with IPD 501, and a plurality of wirebond arrays that electrically connect the above-described components and that form various inductances (e.g., inductances 150, 152, 126, FIG. 1, among others).

The bias voltage lead 562 couples to the bias voltage node 101 of FIG. 1. The bias voltage lead 562 further couples to capacitor 518 which may correspond to the capacitor 118 in the power amplifier circuit 100 of FIG. 1. Capacitor 518 is coupled to or integrally formed with IPD 501, in the embodiment of FIG. 5. In an alternate embodiment, capacitor 518 may be implemented externally (e.g., as with capacitor 418, FIG. 4). The capacitor 518 further couples to a ground node (e.g., substrate 568) which corresponds to the ground node 112 in the power amplifier circuit 100 of FIG. 1. The RF device 555 further includes an RF input lead 564 which corresponds to the RF input node 105 in the power amplifier circuit 100 of FIG. 1 and couples to an RF signal source 104. The RF device 555 yet further includes an RF output lead 566 which corresponds to the RF output node 109 in the power amplifier circuit 100 of FIG. 1.

The RF device 555 includes a substrate 568 (or "flange") on which are mounted IPD 501, FET die 570, and a nonlinear gate current blocking device 540 which corresponds to the nonlinear gate current blocking device 140 in the power amplifier circuit 100 of FIG. 1. In the present embodiment, the nonlinear gate current blocking device 540 and the FET die 570 are coupled to the same substrate 568. The nonlinear gate current blocking device 540 may be coupled to or integrally formed with IPD 501, providing a reduction in size and an improvement in manufacturing for a power amplifier circuit.

The nonlinear gate current blocking device 540 couples to the bias voltage lead 562 by way of an inductor 514 which corresponds to the inductor 114 in the power amplifier circuit 100 of FIG. 1. The nonlinear gate current blocking device 540 further couples to the gate of the FET die 570 by way of an inductor (e.g., configured as wirebonds 571 between FET die 570 and IPD 501) which corresponds to the inductor 126 in the power amplifier circuit 100 of FIG. 1. The nonlinear gate current blocking device 540 further couples to a DC blocking capacitor 524 within IPD 501, which may correspond to the DC blocking capacitor 124 in the power amplifier circuit 100 of FIG. 1.

Figure 6:
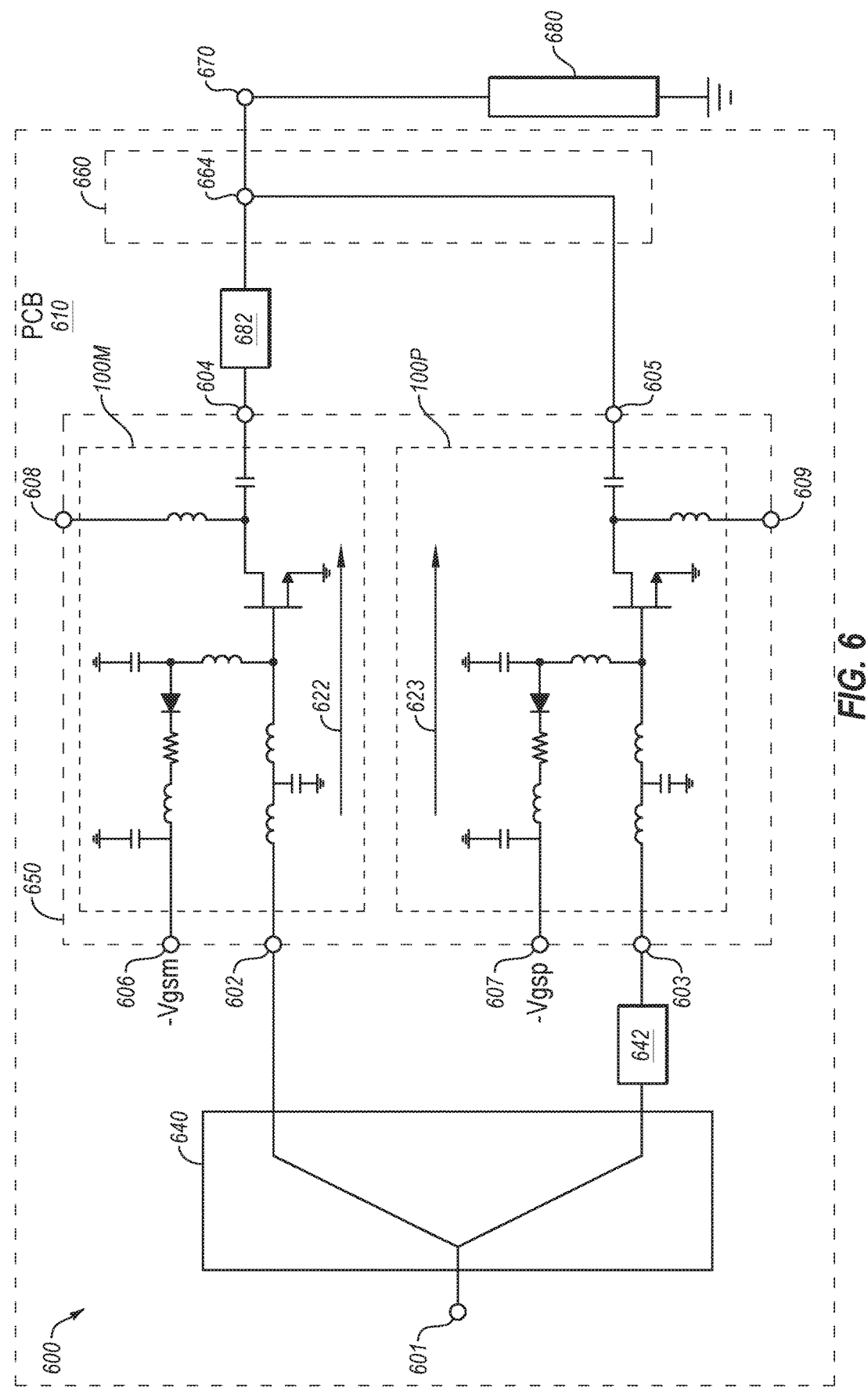
FIG. 6 illustrates a block diagram of a Doherty power amplifier on a PCB, in accordance with an embodiment.

FIG. 6 illustrates a block diagram of a Doherty power amplifier (or amplifier system) 600 on a printed circuit board (PCB) 610, in accordance with an embodiment encompassed herein. The Doherty power amplifier 600 includes an input node 601, an output node 670, a power divider 640, an RF amplifier device 650 (e.g., one or more packaged power transistor devices), and a power combiner 660, according to the present embodiment. The power divider 640 is coupled between the input node 601 and input terminals 602, 603 to the RF amplifier device 650, and the power combiner 660 is coupled between output terminals 604, 605 of the RF amplifier device 650 and the output node 670. An input signal received at the input node 601 is amplified by the Doherty power amplifier (or amplifier system) 600 and provided to a load 680 (e.g., an antenna) via the output node 670.

More specifically, during operation, the power divider 640 is configured to divide the power of the RF input signal received at the input node 601 into multiple portions (e.g., equal portions for a symmetrical Doherty amplifier, or unequal portions for an asymmetric Doherty amplifier) of the input signal, where respective portions of the input signal are provided to the input terminals 602, 603. For example, a first output of the power divider 640 may be coupled to the input terminal 602 corresponding to a first (or main) amplifier path 622, and a second output of the power divider 640 may be coupled to the input terminal 603 corresponding to a second (or peaking) amplifier path 623. The power divider 640 may divide the input power equally among the amplifier paths 622, 623, such that roughly half of the input signal power is provided to each amplifier path 622, 623. Alternatively, the power divider 640 may divide the power unequally.

The Doherty power amplifier (or amplifier system) 600 includes a first phase inversion element 642 between the second output of the power divider 640 and the input terminal 603 corresponding to the peaking amplifier path 623. For example, the first phase inversion element 642 may be implemented as a quarter wave phase shift element (e.g., a 90° phase length transmission line) or a lumped element implementation of a 90° phase shift element. The Doherty power amplifier (or amplifier system) 600 also includes a second phase inversion element 662 between the output terminal 604 corresponding to the main amplifier path 622 and a summing node 664 of the power combiner 660. The output terminal 605 of the peaking amplifier path 623 is also coupled to the summing node 664. As with the first phase inversion element 642, the second phase inversion element 662 may be implemented as a quarter wave phase shift element (e.g., a 90° phase length transmission line) or a lumped element implementation of a 90° phase shift element. The combination of phase inversion elements 642, 662 ensures that the currents ultimately provided to the summing node 664 by the respective amplifier paths 622, 623 are provided substantially in-phase with each other. Accordingly, the current provided by the summing node 664 to the output node 670 (and to the load 680) represents the in-phase summation of the currents provided by the amplifier paths 622, 623.

In an alternate embodiment, positive and negative phase shifts may be applied along both of the amplifier paths 622, 623 at the inputs of the device 650 to achieve approximately 90° of phase difference between the signals processed through the device 650 along the main and peaking amplifier paths 622, 623. In another alternate embodiment, the amplifier system may be configured in an "inverted Doherty" configuration. In such a configuration, the input side phase inversion element is included at the input to the main amplifier path (rather than at the input to the peaking amplifier path), and the output side phase inversion element is included at the output of the peaking amplifier path (rather than at the output of the main amplifier path).

As already noted, the RF amplifier device 650 includes multiple amplifier paths, namely, in this example, the main and peaking amplifier paths 622, 623. Each of the respective amplifier paths 622, 623 includes respective power amplifier circuits 100M, 100P, with each as described above with respect to FIG. 1. The power amplifier circuit 100M is coupled between input terminal 602 and output terminal 604 and also receives a main bias voltage Vgsm at a node 606. Similarly, the power amplifier circuit 100P is coupled between input terminal 603 and output terminal 605 and also receives a peaking bias voltage Vgsp at a node 607.

According to various embodiments, the Doherty power amplifier 600 may be a symmetrical Doherty power amplifier or an asymmetrical Doherty power amplifier. Accordingly, the power transistor die of the power amplifier circuits 100M, 100P may be symmetrical (i.e., substantially the same size) or asymmetrical (i.e., of different sizes). In the Doherty configuration, the main RF power amplifier circuit 100M may be configured and operated as a main amplifier, and the peaking RF power amplifier circuit 100P may be configured as and operated as a peaking amplifier.

During operation of Doherty power amplifier 600, the main power amplifier circuit 110M is biased to operate in class AB mode, and the peaking power amplifier circuit 100P is biased to operate in class C mode. At low power levels, where the power of the input signal at node 601 is lower than the turn-on threshold level of peaking power amplifier circuit 100P, the amplifier 600 operates in a low-power (or back-off) mode in which the main power amplifier circuit 100M is the only amplifier supplying current to the load 680. When the power of the input signal exceeds a threshold level of the peaking power amplifier circuit 100P, the amplifier 600 operates in a high-power mode in which the main power amplifier circuit 100M and the peaking power amplifier circuit 100P both supply current to the load 680. At this point, the peaking power amplifier circuit 100P provides active load modulation at summing node 664, allowing the current of the main power amplifier circuit 100M to continue to increase linearly.

The main RF power amplifier circuit 100M may be configured as a Class AB amplifier, meaning that the transistor arrangement of the main RF power amplifier circuit 100M is biased to provide a conduction angle between 90 and 360 degrees. Conversely, the peaking RF power amplifier circuit 100P may be realized as a transistor arrangement configured as a Class C amplifier, meaning that the transistor arrangement of the peaking RF power amplifier circuit 100P may be biased to provide a conduction angle less than 90 degrees. For example, bias voltages may be provided to the main and peaking RF power amplifier circuits 100M, 100P through terminals 608, 609, each of which may be coupled to an appropriate bias circuit.

A 2-way Doherty amplifier typically employs two separate gate bias networks, one for each the main and peaking RF power amplifier circuits. Depending on the design, at a certain input power level the class-C biased peaking amplifier will begin conducting. With increased drive, the peaking bias is shifted towards class AB operation. However, as the RF drive increases to the point at which the gate starts to conduct positive current, the nonlinear gate current blocking device becomes active. By blocking the forward gate current 132 of FIG. 1, the gate bias remains restricted to a point where highly nonlinear gate behavior is prevented. By blocking the forward gate current, a dynamic DC biasing scheme is created. The DC bias adjusts according to the overdrive as shown in FIG. 2.

It should be understood that FIG. 6 is a simplified representation of a Doherty power amplifier (or amplifier system) 600 for purposes of explanation and ease of description, and that practical embodiments may include other devices and components to provide additional functions and features, and/or the amplifier system 600 may be part of a much larger electrical system, as will be understood. For example, embodiments of devices discussed herein may be incorporated into amplifiers having a single amplification path or more than two amplification paths, as well as amplifiers having configurations other than Doherty configurations.

Figure 7:
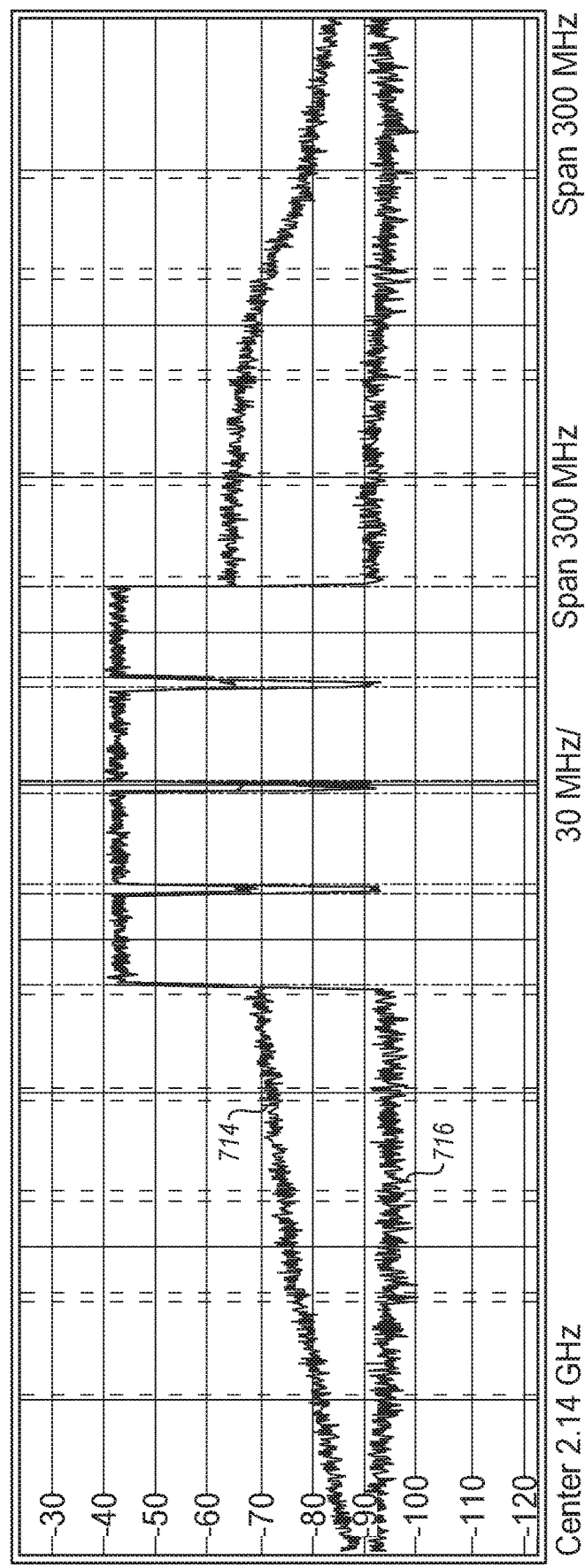
FIG. 7 illustrates a plot of power and frequency of a power amplifier response of a Doherty power amplifier that implements the prematch network with the integrated nonlinear gate current blocking device, in accordance with an embodiment.

FIG. 7 illustrates a plot of power and frequency of a power amplifier response of a Doherty power amplifier that implements the prematch and biasing network with an integrated nonlinear gate current blocking device, in accordance with principles of the embodiments described herein. The illustrated prematch and biasing network with an integrated nonlinear gate current blocking device that is connected to the gate of the FET 108 of FIG. 1 provides forward gate current blocking across an entire signal bandwidth. The frequency response 714 shows that, without digital predistortion, there is significant power (i.e., distortion) in the low-band and high-band frequency ranges. The frequency response 716, which is superimposed with frequency response 714, shows a large reduction in the power of the side bands, even at frequencies just above or below the carrier. The illustrated decoupling network improves both the high instantaneous bandwidth capability, as well as distortion correction of closely-spaced signals. By way of example only, in one form the represented instantaneous bandwidth frequencies are a range of frequencies from D.C. to around the 500 megahertz (MHz) range. The in-band or passband range of frequencies is from around 1.6 gigahertz (GHz) to 3.7 GHz, although the passband range of frequencies could be lower or higher, as well.

In an exemplary implementation, a 2-way symmetrical Doherty power amplifier was configured with GaN FETs (e.g., two of FETs 108) on a substrate with quarter wavelength biasing transmission lines. The main and peaking power amplifier circuits 100M and 100P were, for example, biased at deep Class-AB and Class-C modes, respectively, and at a drain voltage of 48V for the Universal Mobile Telecommunications System (UMTS) band from 2110 MHz to 2170 MHz. The nonlinear gate current blocking device was implemented using a p-n diode with a typical 0.7V voltage drop across the diode.

The gate bias of carrier and peaking were separated to accommodate individual forward gate current blocking. Four cases were measured in order to understand the effect of forward gate current blocking on each individual branch of the Doherty amplifier system 600. The cases were:

Case-i: No nonlinear gate current blocking devices applied along the main and peaking amplifier paths 622, 623;

Case-ii: A nonlinear gate current blocking device in the main power amplifier circuit only;

Case-iii: A nonlinear gate current blocking device in the peaking power amplifier circuit only;

Case-iv: Nonlinear gate current blocking devices in both the main and peaking power amplifier circuits.

All four cases mentioned were measured before and after linearization. In symmetric Doherty operation, the peaking amplifier started to conduct when the fundamental output drain voltage of the carrier amplifier began to saturate. Due to the early conduction of the peaking side, the carrier amplifier of the Doherty amplifier did not compress enough to create a gate overdrive situation. At low and medium power levels, as the carrier amplifier failed to reach hard compression, neither positive gate current nor automatic bias adoption at gate of the carrier was observed.

At close to 9 decibels (dB) back-off, under digitally modulated signal excitation, as the signal peak started to clip at the input of the carrier PA, case-ii enabled mitigation of the carrier gate waveform clipping and hence ~3 decibels relative to the carrier (dBc) raw linearity improvement was observed. At this back-off level, despite introducing forward current blocking along the peaking path (case-iv) in addition to carrier, no linearity improvement was observed. However, driving the carrier power amplifier further under the case-ii scenario degraded the overall Doherty performance, since the carrier power amplifier ceased to load modulate. Hence, to recover the Doherty RF performance, the nonlinear gate current blocking device was switched to the peaking gate bias network (case-iii). In this regard, Doherty linearity improvement was achieved while operating the power amplifier at average back-off power level in accordance with the probability density function (PDF) or the target input-signal (e.g. WCDMA, LTE).

Consequently, at lower back-offs, where the Doherty power amplifier is practically operated for higher efficiency, it may be adequate to use the nonlinear gate current blocking device only along the peaking gate bias network.

As illustrated, the nonlinear gate current blocking device technique may be effective to improve open loop linearity and to aid linearization. Using the nonlinear gate current blocking device technique in a GaN-based Doherty amplifier may be largely effective on the peaking side, and may reduce input distortion at overdrive, resulting in improved linearity. For example, the linearity may be improved in cellular power amplifier applications in which there is no need for complex bias control circuits as the bias is automatically adjusted during overdrive in real time.

While the principles of the invention have been described above in connection with specific apparatus, it is to be clearly understood that this description is made only by way of example and not as a limitation on the scope of the invention. It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A radio frequency (RF) amplifier circuit, comprising:
a first field effect transistor (FET), the first FET including a first gate terminal coupled to a first RF input node; and
a first network coupled between a first bias voltage node and the first gate terminal, the first network including
a first inductor with a first terminal coupled to the first gate terminal, and a second terminal coupled to a second node,
a shunt capacitor with a first terminal coupled to the second node, and a second terminal coupled to a ground reference, and
a first nonlinear gate current blocking device configured to block a first current from flowing between the first bias voltage node and the first gate terminal, wherein the first nonlinear gate current blocking device has a first terminal coupled to the first bias voltage node, and a second terminal coupled to the second node, the first inductor, and the shunt capacitor.

2. The RF amplifier circuit of claim 1, wherein the first nonlinear gate current blocking device is a p-n diode.

3. The RF amplifier circuit of claim 1, wherein the second node is an RF cold point node.

4. The RF amplifier circuit of claim 3, further comprising a low pass filter coupled between the first bias voltage node and the RF cold point node.

5. The RF amplifier circuit of claim 4, wherein the low pass filter includes:
a second capacitor coupled between the first bias voltage node and the ground reference;
a second inductor coupled between the first bias voltage node and the first nonlinear gate current blocking device; and
the first capacitor.

6. A radio frequency (RF) amplifier circuit, comprising:
an amplifier input;
a first field effect transistor (FET), the first FET including a first gate terminal coupled to a first RF input node;
a first network coupled between a first bias voltage node and the first gate terminal, the first network including a first nonlinear gate current blocking device configured to block a first current from flowing between the first bias voltage node and the first gate terminal;
a second field effect transistor (FET), the second FET including a second gate terminal coupled to a second RF input node;
a second network coupled between a second bias voltage node and the second gate terminal, the second network including a second nonlinear gate current blocking device configured to block a second current from flowing between the second bias voltage node and the second gate terminal;
a power divider including an input and first and second outputs, the power divider configured to divide power of an input signal received at the amplifier input into a first RF input signal provided to the first RF input node, and into a second RF input signal provided to the second RF input node; and
a power combiner including a first input coupled to a first drain terminal of the first FET and a second input coupled to a second drain terminal of the second FET, the power combiner further including an output node configured for coupling to a load.

7. The RF amplifier circuit of claim 1, wherein the first FET belongs to a III-V FET enhancement group.

8. A radio frequency (RF) amplifier, comprising:
a substrate; and
a first RF amplifier circuit coupled to the substrate, the first RF amplifier circuit including:
a first field effect transistor (FET), the first FET including a gate terminal coupled to a first RF input node; and
a first network coupled between a first bias voltage node and the first gate terminal, the first network including
a first inductor with a first terminal coupled to the first gate terminal, and a second terminal coupled to a second node,
a shunt capacitor with a first terminal coupled to the second node, and a second terminal coupled to a ground reference, and
a first nonlinear gate current blocking device configured to block a first current from flowing between the first bias voltage node and the first gate terminal, wherein the first nonlinear gate current blocking device has a first terminal coupled to the first bias voltage node, and a second terminal coupled to the second node, the first inductor, and the shunt capacitor.

9. The RF amplifier of claim 8, wherein the first nonlinear gate current blocking device is a p-n diode.

10. The RF amplifier of claim 8, wherein the second node is an RF cold point node.

11. The RF amplifier of claim 10, further comprising a low pass filter coupled between the first bias voltage node and the RF cold point node.

12. The RF amplifier of claim 11, wherein the low pass filter includes:
a second capacitor coupled between the first bias voltage node and the ground reference;
a second inductor coupled between the first bias voltage node and the first nonlinear gate current blocking device; and
the first capacitor.

13. A radio frequency (RF) amplifier, comprising:
a substrate;
a first RF amplifier circuit coupled to the substrate, the first RF amplifier circuit including:
an amplifier input;
a first field effect transistor (FET), the first FET including a gate terminal coupled to a first RF input node,
a first network coupled between a first bias voltage node and the first gate terminal, the first network including a first nonlinear gate current blocking device configured to block a first current from flowing between the first bias voltage node and the first gate terminal,
a second field effect transistor (FET), the second FET including a second gate terminal coupled to a second RF input node,
a second network coupled between a second bias voltage node and the second gate, the second network including a second nonlinear gate current blocking device configured to block a second current from flowing between the second bias voltage node and the second gate,
a power divider including an input and first and second outputs, the power divider configured to divide power of an input signal received at the amplifier input into a first RF input signal provided to the first RF input node, and into a second RF input signal provided to the second RF input node, and a power combiner including a first input coupled to a first drain terminal of the first FET and a second input coupled to a second drain terminal of the second FET, the power combiner further including an output node configured for coupling to a load.

14. A radio frequency (RF) module, comprising:
a printed circuit board (PCB); and
an RF amplifier device coupled to the PCB, the RF amplifier device including:
  a substrate;
  a field effect transistor (FET) coupled to the substrate, the FET including a gate terminal coupled to an RF input node; and
  a network coupled between a bias voltage node and the gate terminal, the network including:
    a first inductor with a first terminal coupled to the first gate terminal, and a second terminal coupled to a second node,
    a shunt capacitor with a first terminal coupled to the second node, and a second terminal coupled to a ground reference, and
    a nonlinear gate current blocking device configured to block a current from flowing between the bias voltage node and the gate terminal, wherein the nonlinear gate current blocking device has a first terminal coupled to the first bias voltage node, and a second terminal coupled to the second node, the first inductor, and the shunt capacitor.

15. The RF module of claim 14, further comprising an integrated passive device (IPD) including the FET, the IPD and the nonlinear gate current blocking device coupled to the PCB.

16. The RF module of claim 14, further comprising an integrated passive device (IPD) including the FET and the nonlinear gate current blocking device, the IPD coupled to the PCB.

17. The RF amplifier circuit of claim 1, wherein the first terminal of the first nonlinear gate current blocking device is a cathode, and the second terminal of the first nonlinear gate current blocking device is an anode.

18. The RF amplifier of claim 8, wherein the first terminal of the first nonlinear gate current blocking device is a cathode, and the second terminal of the first nonlinear gate current blocking device is an anode.

19. The RF module of claim 14, wherein the first terminal of the nonlinear gate current blocking device is a cathode, and the second terminal of the nonlinear gate current blocking device is an anode.

* * * * *